United States Patent [19]
Oka et al.

[11] Patent Number: 5,801,870
[45] Date of Patent: Sep. 1, 1998

[54] LIGHT EXPOSURE AND ILLUMINATING APPARATUS

[75] Inventors: Michio Oka, Kanagawa; Hiroshi Suganuma, Ibaragi, both of Japan

[73] Assignee: Sony Corporation, Tokyo, Japan

[21] Appl. No.: 824,310

[22] Filed: Mar. 26, 1997

Related U.S. Application Data

[63] Continuation of Ser. No. 502,460, Jul. 14, 1995, Pat. No. 5,673,134.

[30] Foreign Application Priority Data

Jul. 15, 1994 [JP] Japan ................................. 6-163948

[51] Int. Cl.⁶ .................................................. G02B 26/08
[52] U.S. Cl. ........................... 359/216; 359/208; 359/218; 359/219; 355/67
[58] Field of Search .................................. 359/196, 205, 359/208, 212–219; 355/53, 67, 71; 372/22; 250/234–236

[56] References Cited

U.S. PATENT DOCUMENTS

| | | | |
|---|---|---|---|
| 3,520,586 | 7/1970 | Bousky | 359/208 |
| 5,416,630 | 5/1995 | Ito et al. | 359/208 |
| 5,473,409 | 12/1995 | Takeda et al. | 355/53 |
| 5,528,027 | 6/1996 | Mizutani | 250/234 |
| 5,673,134 | 9/1997 | Oka et al. | 359/196 |

*Primary Examiner*—James Phan
*Attorney, Agent, or Firm*—Hill & Simpson

[57] ABSTRACT

A light exposure illuminating apparatus is provided which, employing harmonics of a continuously outputted laser beam, is small-sized, inexpensive and free from speckles and which achieves a high light source utilization efficiency. Specifically, a harmonics generating 1 generates fourth harmonics which are reflected and swept via a scanning lens 2 by a polygonal mirror 3. A cylindrical reflecting mirror radiates the fourth harmonics reflected by the polygonal mirror 3 on an arcuate aperture formed in a light exposure mask by a sweeping movement. The light of fourth harmonics transmitted through the arcuate aperture reaches a reticle 7 set on a semiconductor pattern. The illuminating light passed through the reticle 7 is projected on a wafer 9 via a concave mirror 5 and a convex mirror 76. The area of light exposure may be increased since the reticle 7 and the wafer 9 are moved in synchronism with the scanning of the scanning optical system.

1 Claim, 3 Drawing Sheets

LIGHT EXPOSURE AND ILLUMINATING APPARATUS

This is a continuation of application Ser. No. 08/502,460 filed Jul. 14, 1995, U.S. Pat. No. 5,673,134.

BACKGROUND OF THE INVENTION

This invention relates to a light exposure and illuminating apparatus for supplying the outgoing light from a light exposure source to an area desired to be exposed to light for irradiating the area with light.

Ultra-fine lithographic machining is employed for preparation of semiconductor or liquid crystal devices. It is the light exposure and illuminating apparatus that illuminates a workpiece with a pattern to be recorded in the ultra-fine lithographic machining.

A projecting optical system is employed in the light exposure and illuminating apparatus for printing a fine device pattern in the ultra-fine lithographic machining. The reflective optical system or a reflective-refractive projecting optical system, above all, is an optical system including plural reflective mirrors and effectuating printing with the aid of an arcuate illuminating light beam. As the light exposure and illuminating apparatus using the reflective-refractive projecting optical system is known, as described in A.OFFNER, Electro-Optical Division, The Perkin-Eimer Corporation, So. Wilton, Connecticut 06897, "New Concepts in Projection Mask Aligners," Optical Engineering, Vol.14(2), pp. 130–132 (March-April 1975), and R. T. KERTH, KANTI JAIN, senior member, IEEE, and M. R. LATTA, "Excimer Laser Projection Lithography on a Full-Field Scanning Projection System," IEEE Electron Device Letters, Vol.EDL-7(5), pp. 299–301 (May 1986).

The 1:1 reflective projecting light exposure apparatus is now explained by referring to FIG. 1 showing the construction of an imaging optical system thereof.

The reflective projecting light exposure apparatus is made up of a concave mirror 31 and a convex mirror 32 and configured for radiating an arcuate illuminating light 34 on a reticle 33 for projecting a pattern on the reticle 33 on a wafer 35 in order to effect light exposure by scanning the reticle 33 and the wafer 35 relative to each other.

FIG. 2 shows a conventional arcuate light illuminating apparatus having a collimated light beam as a light source as disclosed in JP Patent Kokai Publication JP-A-59-216118. The arcuate light illuminating apparatus is made up of spherical lenses 41, 42, a reflective mirror 43, a cylindrical lens 44, a cylindrical reflective mirror 45 and a diffusion plate 46, and is configured for condensing a parallel light beam 47 to an arcuate shape at a position of the diffusion plate 46.

So far, the light source used for these light exposure and illuminating apparatus is required to meet various requirements, such as radiating a laser light beam of a shorter wavelength, being small-sized and low in costs inclusive of maintenance costs, being able to radiate laser light excellent in monochromaticity, non-coherency and uniformity without fluctuations and exhibiting superior light utilization efficiency.

The laser light having a short wavelength is required because the outgoing light with a short wavelength is able to effect light exposure so as to cope with a high-resolution light exposure pattern. If the apparatus is small-sized and of low costs inclusive of maintenance costs, the apparatus may naturally be inexpensive. If the laser light is not coherent, no speckles are produced. On the other hand, the laser light superior in mono chromaticity, uniform without fluctuations and capable of achieving a high utilization efficiency is desirable in a well-known manner.

However, the light source satisfying all of these requirements has been difficult to manufacture. For example, it has been contemplated to use an excimer laser which is superior in mono chromaticity and directivity and which is capable of radiating the laser light of low coherency and achieving multiple mode oscillation. However, the apparatus for generating the excimer laser is bulky in size. In effect, an equipment which takes up a large space, such as a cooling water equipment, or a risky device such as toxic gas equipment, has been required for generating the excimer laser. This necessitates a lot of maintenance costs.

As other light sources, a high-output solid laser such as YAG, $YVO_4$, Nd-glass laser, or a high-output gas laser such as an argon gas laser, converted to a short wavelength light source by a waveform converting technique employing a non-linear optical system, has been devised. However, the laser light radiated by these light sources is not suited as a light source for the light exposure illuminating apparatus since it is high in coherency, as a result of which interference effects such as speckles or standing waves are produced.

SUMMARY OF THE INVENTION

It is therefore an object of the present invention to provide a light exposure and illuminating apparatus which through use of harmonics of a laser light of continuous light output, is small-sized, inexpensive, free from speckles and is capable of achieving a high light source exploitation efficiency.

According to the present invention, there is provided a light exposure and illuminating apparatus for conducting a light beam from a light source to an object to be exposed to light, which includes harmonics light generating means for continuously radiating the light of harmonics, a scanning optical system for sweeping the light of harmonics continuously radiated from the harmonics generating means, a pattern irradiated with the light of harmonics swept by the scanning optical system and an imaging optical system for forming an image of the light of harmonics transmitted through the pattern on the object to be exposed to light.

The scanning optical system includes scanning means for spatially sweeping the light of harmonics cutaneously radiated by the harmonics light generating means and reflecting means for reflecting the light of harmonics swept by the scanning means towards the mask. Specifically, the scanning means includes a scanning lens for converting the light beam of harmonics to a scanning beam and a polygonal mirror for reflecting and sweeping the light beam of harmonics on a rotating plane reflecting surface. The reflecting means includes a cylindrical reflecting mirror for sweeping the light of harmonics, swept by the scanning means, on the mask in an arcuate form.

The light of harmonics is transmitted through a pattern moved in synchronism with scanning of the scanning optical system so as to be imaged on the object to be exposed to light, which object is moved in synchronism with scanning by the scanning optical system. The result is that the light of harmonics swept on the pattern is further swept with a variable width along the path of movement of the pattern.

The means for generating the light of harmonics radiates the light of fourth harmonics of a solid laser.

With the light exposure illuminating apparatus according to the present invention, the scanning optical system sweeps the light of harmonics continuously radiated by the means for generating the light of harmonics on a pattern, and the imaging optical system forms an image of the light of harmonics transmitted through the pattern, on the object to be imaged. Thus there is afforded the degree of freedom of optimizing the scanning area of the spot of the light of harmonics in conformity to the imaging optical system. Since the object to be imaged, that is a wafer, and the pattern, that is a mask, are moved in timed relation to the spot scanning, it becomes possible to increase the area of light exposure. Consequently, with the light exposure illuminating apparatus of the present invention, the designing of the optical system may be facilitated, while a high imaging performance may be achieved. Since it is possible for the imaging optical system to image a point object as a point image at each instant, there is no risk of the imaging deterioration due to speckles. Consequently, the light exposure illuminating apparatus of the present invention, employing harmonics of a laser light of continuous output, may be small-sized, lightweight and free from speckles, while achieving a high light source utilization efficiency.

For enlarging the light exposure area, it suffices to effect joint movement of the mask and the wafer. If there is raised a problem in connection with accuracy in spot scanning or stage movement, it suffices to enlarge the spot size in a required amount. If speckles are generated in the imaging optical system, it suffices to annex a diffusion plate at a suitable position in the optical path of the scanning optical system. If the diffusion plate is provided in the vicinity of the diffusion plate and, if need be, an aperture is formed in the scanning area, the beam is spread by the diffusion plate. On the other hand, the speckles are averaged by integrating effects by the averaging due to scanning, as a result of which optimum image-forming properties may be achieved.

DESCRIPTION OF THE PREFERRED EMBODIMENTS

Figure 1:
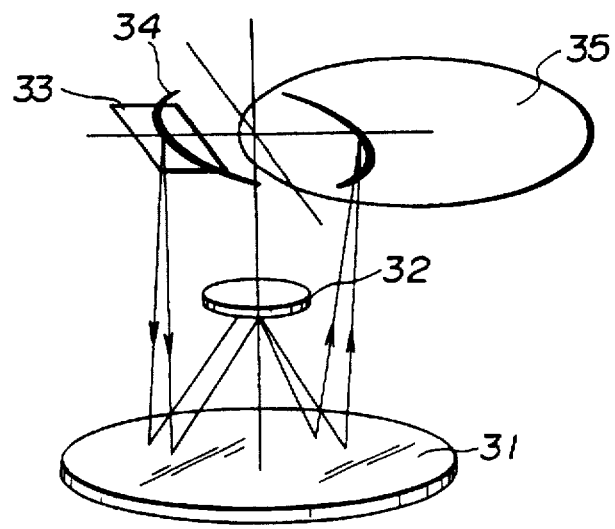
FIG. 1 is a schematic perspective view showing an imaging optical system of a conventional reflective projecting light exposure apparatus.
Figure 2:
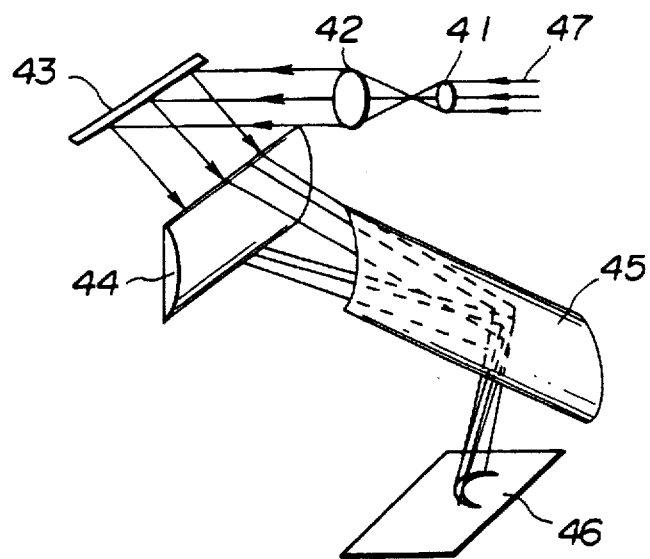
FIG. 2 is a schematic perspective view showing a conventional arcuate illuminating apparatus.
Figure 3:
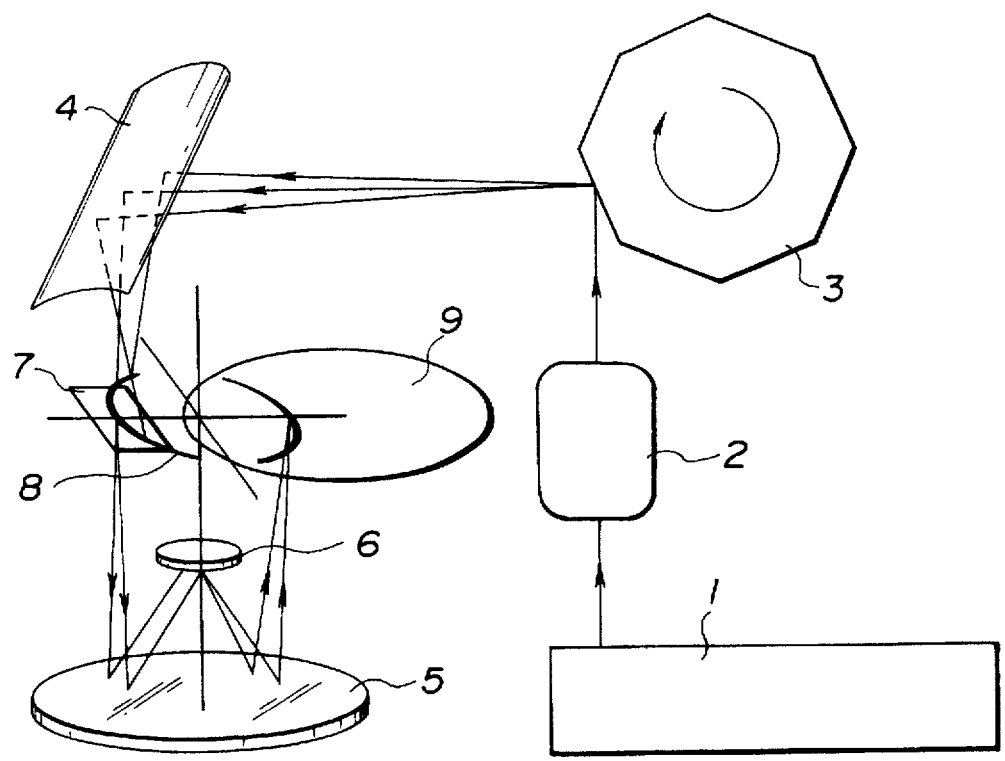
FIG. 3 is a schematic perspective view showing a reflective projecting light exposure and illuminating apparatus according to an embodiment of the present invention.

Referring to the drawings, preferred embodiments of the light exposure and illuminating apparatus according to the present invention will be explained. FIG. 3 illustrates the construction of a 1:1 light exposure and illuminating apparatus.

The light exposure and illuminating apparatus includes a harmonics light generating unit 1 radiating fourth harmonics from e.g., a solid laser, such as a Nd-Yag laser, a scanning optical system for sweeping the fourth harmonics continuously radiated from the harmonics generating unit 1 on an arcuate aperture in a light exposure mask, not shown, and an imaging optical system for forming an image by the fourth harmonics light transmitted through the aperture on a wafer 9 as an object to be exposed to light.

The scanning optical system has a scanning lens 2 for setting the diameter of a light beam of the fourth harmonics continuously radiated from the harmonics generating unit 1 to a scanning beam diameter, a polygonal mirror 3 for reflecting the fourth harmonics from the scanning lens 2 on a rotating plane reflecting surface with sweeping movement and a cylindrical reflecting mirror 4 for directing the fourth harmonics reflected by the polygonal mirror 3 to the mask with sweeping movement for illumination.

The imaging optical system includes a concave mirror 5, a convex mirror 6, a reticle 7 on which a semiconductor pattern, for example, is set, and a wafer 9 displaced along with the reticle 7 in synchronism with the scanning by the scanning optical system.

The conventional harmonics light generating device has not been able to produce a high light output. However, there has recently been reported a UV laser capable of outputting 1W UV laser light as fourth harmonics of e.g. a YAG laser.

Figure 4:
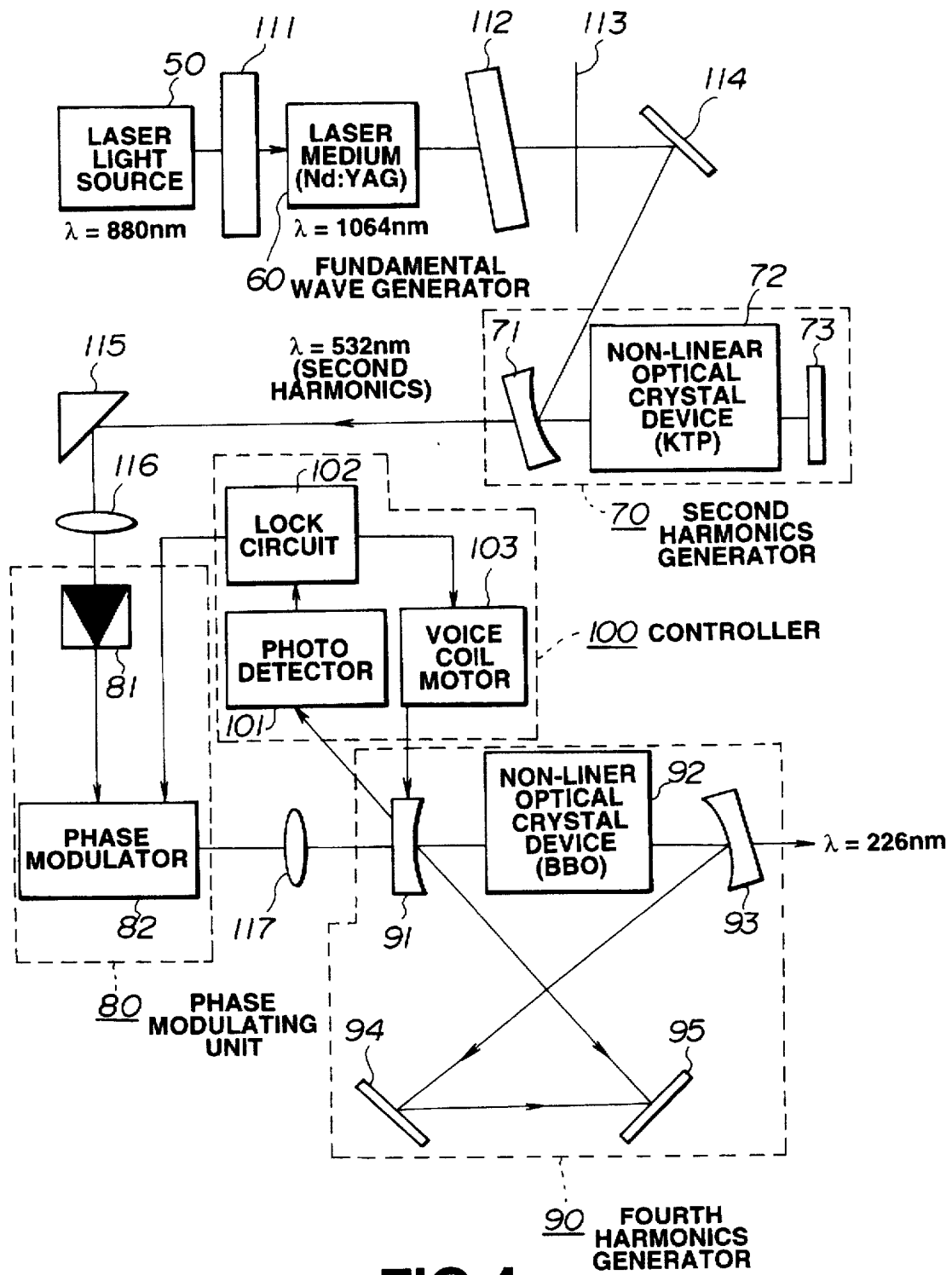
FIG. 4 is a schematic block diagram showing a high harmonics generating device employed in the present invention.

In FIG. 4, there is shown an arrangement of a high harmonics generator 1. The fourth harmonics generator 1 includes a laser light source 50 for radiating an excitation laser light, a basic wave generating unit 60 excited by an exciting laser light from the laser light source 50 for generating the laser light of the basic wave and a second harmonics generating unit 70 having a first non-linear optical crystal element for wavelength-converting the laser light of the basic wave into a laser light of the second harmonics. The fourth harmonics generator 1 also comprises a phase modulation unit 80 for phase modulation of the second harmonics laser light radiated from the second harmonics generating unit, and a fourth harmonics generating 90 having a second non-linear optical crystal element for wavelength-converting the second harmonics laser light into a fourth harmonics laser light which is outputted. The fourth harmonics generator 1 further includes a controller 100 for controlling the fourth harmonics generating unit 90 for satisfying the conditions of generation of the fourth harmonics laser light.

The laser light source 50 comprises at least one semiconductor laser for radiating an excitation laser light beam having a wavelength of 880 nm. The basic wave generating unit 60 is a Nd:YAG laser medium, as an example, and is excited by the excitation laser light for generating a laser light of the basic wavelength of 1064 nm.

The second harmonics generating unit 70 has a first resonator which is made up of a concave mirror 71 for producing resonation at a wavelength of the laser light of the basic wave, a plane mirror 73 and a first non-linear optical crystal element 72 provided between the concave mirror 71 and the plane mirror 73. The first non-linear optical crystal element 72 is formed of KTiOPO$_4$ (KTP) and wavelength-converts the basic wave laser light into the second harmonics laser light. The reflective surface of the plane mirror 73 reflects the basic wave laser light and the second harmonics laser light, while the reflective surface of the concave mirror 71 reflects the basic wave laser light and transmits only the second harmonics laser light. Resonation at the wavelength of the incident basic wave laser light is produced by the plane mirror 73 and the concave mirror 71. Since the first non-linear optical crystal element 72 is provided between the plane mirror 73 and the concave mirror 71, the basic wave laser light is wavelength-converted into the second harmonics laser light under the non-linear optical effect of the first non-linear optical crystal element. Thus the second harmonics laser light having the wavelength of 532 nm is outputted from the concave mirror 71.

The phase modulation unit 80 is made up of a phase modulator 82 for phase-modulating the second harmonics laser light and an optical isolator 81 for preventing reversion of the light incident on the phase modulator 82 having, for example, an electro-optical effect device. The phase modulator 82 is fed with the position error detected by a control unit 80 as later explained. The phase modulator 82 phase-modulates the second harmonics laser light for detecting the light volume of the control unit 80 based on the position error. The second harmonics laser light, having the frequency of about 500 to 600 THz, performs phase modulation at 10 THz.

The fourth harmonics generating unit 90 has a second resonator made up of a concave mirrors 91, 93 resonated at a wavelength of the second harmonics laser light, a second non-linear optical crystal element 92 provided between the concave mirrors 91, 93, and plane mirrors 94, 95 mounted facing the concave mirrors 91, 93. The second non-linear optical crystal element 92, formed e.g., of barium borate (BBO), wavelength-converts the second harmonics laser light into fourth harmonics laser light. The reflective surfaces of the concave mirrors 91, 93 are coated with reflective films capable of transmitting only the fourth harmonic laser light. The concave mirror 91 is driven along the optical axis by the control unit 100 as later explained, for satisfying the conditions of laser oscillation. On the other hand, for increasing the laser light path during resonation, the plane mirrors 94, 95 are mounted facing the concave mirrors 91, 93. Since the second non-linear optical crystal element 92 is provided between the concave mirrors 91 and 93, the second harmonics laser light is wavelength-converted into the fourth harmonics laser light under the non-linear optical effect proper to the second non-linear optical effect. Thus the fourth harmonics laser light having the wavelength of 266 nm is taken out from the concave mirrors 91, 93.

For the fourth harmonics generating unit 90, a Fabry-Perot resonator made up of two concave mirrors facing each other is employed. The Fabry-Perot resonator is set into resonant oscillations at a optical path phase difference equal to $2\pi$, with the phase of reflection being significantly changed in the vicinity of the phase of resonation. It is disclosed in "Laser Phase and frequency Stabilization Using an Optical resonator", by R. W. P. Drever et al. in Applied Physics B 31.97–105 (1983) to control the frequency of the resonator by taking advantage of such phase change. It is this technique that is utilized in the fourth harmonics generating unit 90.

The control unit 100 is made up of a photodetector 101, such as a photodiode, for detecting the light volume of the fourth harmonics laser light, a lock circuit 102 for realizing high precision position error detection based on the detected light volume and a voice coil motor 103 for driving the concave mirror 91 of the fourth harmonics generating unit 90. The position error detected by the lock circuit 102 is supplied to the voice coil motor 103 and to the phase modulator 80 of the phase modulation unit 80. The voice coil motor 103 drives the concave mirror 91 of the fourth harmonics generating unit 90 along the optical axis for reducing the phase error to zero.

The fourth harmonics of the laser light is generated using the above-described fourth harmonics generator 1. Specifically, the laser light source 50 radiates a laser light for excitation. The laser light is converted by a quarter wave plate 111 from the linear polarized state to the circular polarized state. The laser light is then incident on the basic wave generator 60. The basic wave generator 60, that is the Nd:YAG laser medium, is excited by the laser light for producing a laser light of the basic wavelength, which is then reduced in bandwidth by an ethalon 112. The laser light of the basic wavelength, thus reduced in bandwidth, is partially taken out via a pinhole 113. The laser light of the basic wavelength is reflected by a plane mirror 114 so as to be incident on the second harmonics generator 70 as a first resonator. The second harmonics generator 70 is resonated at the wavelength of the laser light of the basic wavelength and converts the wavelength of the laser light using the first non-linear optical crystal 72. Thus the laser light of the second harmonics is taken out from the second harmonics generator 70. The laser light of the second harmonics is bent in its proceeding direction by 90° by a mirror 115 before being incident via a light converging lens 116 to the phase modulator 80. The laser light of the second harmonics, phase-modulated by the phase modulator 80, is incident via a converging lens 117 on the fourth harmonics generator 90 as a second resonator. The fourth harmonics generator 90 is resonated at the wavelength of the second harmonics and converts the wavelength of the laser light using the second linear optical crystal 92. The laser light of the fourth harmonics is taken out from the fourth harmonics generator 90 as the light for light volume detection and as the light for exposure. The laser light of the fourth harmonics is radiated in an amount substantially proportionate to the light volume of the laser light radiated from the laser light source 50. The controller 100 controls the fourth harmonics generator 90 so that, based on the laser light of the fourth harmonics taken out as the light for light volume detection, the optical path length of the laser light at the fourth harmonics generator 90 will be a resonating length.

By adjusting the light volume of the excitation laser light by the above construction, it becomes possible to adjust the light volume of the laser light of the fourth harmonics as the exposure laser light.

The laser medium in the basic wave generating unit 20 may also be Nd:VO$_4$, Nd:BEL or LNP, in place of Nd:YAG. The first non-linear optical crystal element 72 or the second non-linear optical crystal element 92 may also be formed of LN, QPN, LBO, KN or KDP (potassium dihydrogen phosphate) in place of KTP or BBO.

The fourth harmonics, thus continuously radiated from the harmonics generator 1, generate an image of a point object by the operation of an imaging optical system, so that it becomes possible to prevent an image from being deteriorated due to speckles.

The polygonal mirror 3 has a series of plane reflecting surfaces on its outer periphery for reflecting the fourth harmonics via the scanning lens 2 on the cylindrical reflecting mirror 4. The polygonal mirror 3 and the scanning lens 2 make up a scanning optical system for effecting spatial sweeping of the fourth harmonics radiated by the harmonics generating device 1.

The fourth harmonics, spatially swept by the scanning optical system, is reflected by the cylindrical reflecting mirror 4. By such reflection, the reticle 7, carrying a pattern for a semiconductor, is irradiated with an arcuate illuminating light 8. Arcuate-shaped light irradiation is effective to correct the reflective imaging system for aberration. The illuminating light 8, transmitted through the reticle 7, is projected on the wafer 9 via the concave mirror 5 and the convex mirror 6. Since the reticle 7 and the wafer 9 are moved in synchronism with the scanning of the scanning optical system, it becomes possible to enhance the area of light exposure.

It will be appreciated from the foregoing that the reflective projecting light exposure illumination apparatus of the embodiment illustrated sweeps the arcuate illuminating light, which is the condensed fourth harmonics radiated from the harmonics generating unit 1, on the reticle 7, and forms an image of the pattern on the wafer 9. In addition, the movement of the imaging optical system is coordinated to that of the reticle 7, so that there is afforded a degree of freedom in optimizing the scanning area of the illuminating light 8 in conformity to the imaging optical system, while it becomes possible to enlarge the area of light exposure. The result is that the designing of the optical system is facilitated and high imaging performance may be achieved.

The harmonics continuously radiated from the harmonics generating device 1 form an image of a point object as a point image, by the operation of the imaging optical system, so that an image may be prohibited from being deteriorated due to speckles.

It is seen from above that the reflective projecting light exposure and illuminating apparatus, employing harmonics of a continuously radiated laser beam, is small-sized and inexpensive, while being free from speckles and achieving a high light source utilization efficiency.

Figure 5:
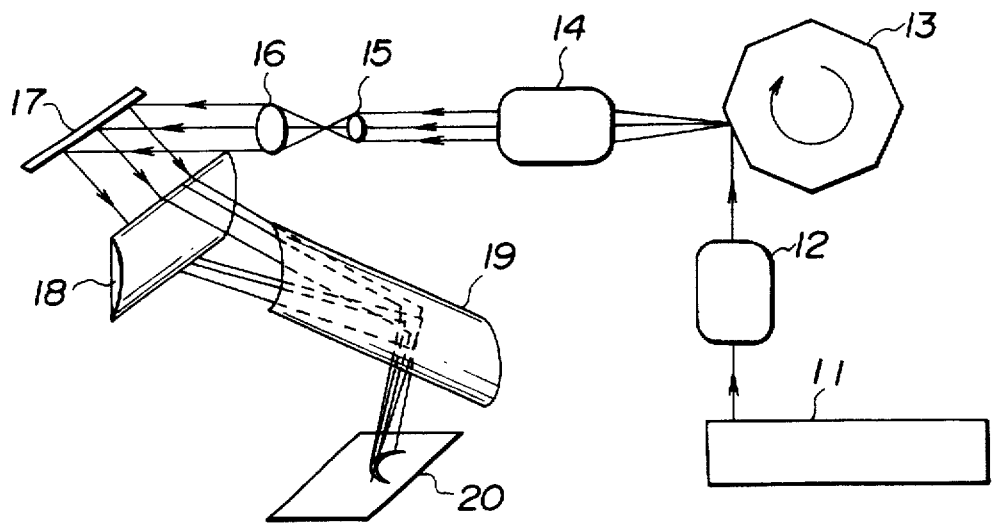
FIG. 5 is a schematic perspective view showing an arcuate illuminating apparatus according to a modification.

A light exposure and illuminating apparatus according to a modification of the present invention is now explained by referring to FIG. 5 showing the construction of the modification. The arcuate light illuminating apparatus is employed for scanning an illuminated area using a spot larger in size.

The arcuate light illuminating apparatus according to the modification includes a harmonics light generating unit 11 radiating fourth harmonics from e.g., a solid laser, such as a Nd-Yag laser, a scanning optical system for sweeping the fourth harmonics continuously radiated from the harmonics generating unit 11 on a light exposure mask, not shown, along an arcuate path, and an imaging optical system for forming an image by the fourth harmonics light transmitted through the mask on a wafer, not shown, as an object to be exposed to light.

The illuminating optical system is made up of a scanning lens has a scanning lens 12 for setting the diameter of a light beam of the fourth harmonics continuously radiated from the harmonics generating unit 11 to a scanning beam diameter, a polygonal mirror 13 for reflecting the fourth harmonics from the scanning lens 12 on a rotating plane reflecting surface with sweeping movement, a scanning lens 14 for collimating the fourth harmonics reflected by the polygonal mirror 13, spherical lenses 15, 16, a reflecting mirror 17, a cylindrical lens 18, a cylindrical reflecting mirror 19 and a diffusion plate 20.

The fourth harmonics, radiated from the harmonics generating unit 1, are spatially swept by a scanning optical system made up of the scanning lens 12, the polygonal mirror 13 and the scanning lens 14.

The light beam of the fourth harmonics, thus spatially swept by the scanning optical system, is increased in diameter by a beam expanding optical system. The light beam of the fourth harmonics, thus increased in diameter by the beam expanding optical system, is reflected by the reflecting mirror 17 before being converged in one direction by the cylindrical lens 18.

The light beam of the fourth harmonics, thus condensed in one direction by the cylindrical lens 18, is reflected by the cylindrical reflecting mirror 19. By this reflection, an arcuate illuminating light is swept on the diffusion plate 20.

The function of the diffusion plate 20 is to further prohibit speckles, prohibited to a certain extent by the harmonics continuously radiated by the harmonics generating device 11. The light beam of the fourth harmonics from the diffusion plate 20 is transmitted through a pattern on the reticle constituting an imaging optical system, not shown, so as to be projected on a wafer via a concave mirror and a convex mirror similar to those shown in FIG. 3. The reticle and the wafer are moved in synchronism with the scanning of the scanning optical system for enlarging the light exposed area.

It will be appreciated from the foregoing that the arcuate illumination apparatus of the embodiment illustrated enlarges the light beam of the fourth harmonics, radiated from the harmonics generating unit 11, by the beam expanding optical system constituted by the spherical lenses 15 and 16, for condensing the enlarged collimated light in an arcuate shape on the diffusion plate 20. The beam is expanded by the diffusion plate and averaged by scanning, while speckles are averaged by integrating effects, thus resulting in optimum imaging characteristics.

With the reflecting projecting light exposure and illuminating apparatus shown in FIG. 3 or the arcuate illuminating apparatus shown in FIG. 5, the fourth harmonics via the scanning lenses 2 or 12 are reflected by the polygonal mirrors 3 or 13. The scanning lenses and the polygonal mirrors are termed the scanning optical system, as mentioned hereinabove. The scanning optical system portion may also be constituted by a galvano-mirror or an acousto-optical element. The scanning optical system employing a transmission or reflection type hologram may also be employed for simplifying the construction. If a high precision stage can be employed, scanning may be achieved by a mechanical device. These systems may also be used in combination for achieving optimum designing. Although reflective type optical devices are used in a portion of the above-described system, these reflective type devices may be replaced by reflective type devices to provide a full reflective type illumination system. Alternatively, reflective and refracting devices may be used in combination to provide a combined scanning optical system.

Although the 1:1 reflective optical system has been described above by way of an example, the present invention may also be applied to a refractive type imaging system or to an imaging system consisting in combination of reflective and refractive imaging systems. In such case, the scanning area of a spot on a pattern may be of a desired optimum shape which is in meeting with characteristics of the imaging system. Since there is limitation on the large-sized high quality material in the UV range, the reflective type optical imaging system is preferred for achromatism if a light source employed is of such properties that the wavelength range in the vicinity of 200 nm is objectionable. Since it suffices in the present invention to repeat the scanning and stepped movements in meeting with the narrow field of the imaging system and hence the present invention may be applied to a wide variety of optical systems. This enables the size of the optical imaging system to be reduced while enlarging the types of the materials in the fabrication of optical devices.

For controlling the speed of stage movement or achieving synchronism in scanning, it is possible to provide a detecting mechanism for enhancing the precision. It is also possible to provide an alignment mechanism for improving the precision further.

With the above-described arrangements, it becomes possible to reduce the number of components possible leading to loss of light volume to a minimum for achieving efficient beam propagation.

On the other hand, high performance drawing may be feasible with a simpler control mechanism and higher control precision than in the case of direct scanning without employing the mask, such as direct laser drawing or electronic line drawing device.

What is claimed in:

1. A light exposure illuminating apparatus for conducting a light beam source to an object to be exposed to light comprising:

harmonics light generating means for continuously radiating the light of harmonics;

a scanning optical system for sweeping the light of harmonics continuously radiated from said harmonics generating means, said scanning system comprising a scanning lens which sets the diameter of the light harmonics to a scanning beam diameter and a mirror with at least one moving reflector surface which reflects the light of harmonics from the scanning lens in a sweeping motion;

a patterned mask irradiated in a sweeping motion with the light of harmonics swept by the scanning optical system;

a cylindrical mirror which receives the light of harmonics reflected by the mirror with the moving reflection surface and which reflects said light onto said patterned mask; and an imaging optical system for forming an image of the light of harmonics transmitted through said pattern in the object to be exposed to light, wherein, said pattern and said object to be exposed to light are configured to be moved in synchronism with said scanning optical system, wherein, said mirror with a moving reflection surface comprises a rotating polygonal mirror having a plurality of reflector surfaces defining the sides of the polygon, the rotating polygonal mirror has more than four reflector surfaces, and the light generated by the harmonics light generating means is a fourth harmonics light.

* * * * *